(12) United States Patent
Rakel et al.

(10) Patent No.: US 6,523,152 B1
(45) Date of Patent: Feb. 18, 2003

(54) FRAMEWORK FOR RULES CHECKING UTILIZING RESISTOR, NONRESISTOR, NODE AND SMALL NODE DATA STRUCTURES

(75) Inventors: Ted Scott Rakel, Fort Collins, CO (US); John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/521,866

(22) Filed: Mar. 8, 2000

(51) Int. Cl.[7] .............................................. G06F 17/50
(52) U.S. Cl. .................... 716/5; 716/4; 716/6
(58) Field of Search ...................... 716/4, 5, 6

(56) References Cited

U.S. PATENT DOCUMENTS

| | | | |
|---|---|---|---|
| 4,858,146 A | 8/1989 | Shebini ...................... 364/512 |
| 5,289,567 A | 2/1994 | Roth ......................... 395/133 |
| 5,394,524 A | 2/1995 | DiNicola et al. ........... 395/163 |
| 5,522,022 A | 5/1996 | Rao et al. ................... 395/140 |
| 5,787,274 A | 7/1998 | Agrawal et al. ............ 395/613 |
| 5,802,508 A | 9/1998 | Morgenstern ................ 706/55 |
| 5,867,395 A | * 2/1999 | Watkins et al. ............. 364/488 |
| 5,910,897 A | * 6/1999 | Dangelo et al. ............ 364/488 |
| 5,978,571 A | * 11/1999 | Grundmann ................ 395/500 |
| 5,987,237 A | 11/1999 | McBride ................ 395/500.01 |
| 6,011,911 A | * 1/2000 | Ho et al. ............... 395/500.06 |
| 6,055,366 A | * 4/2000 | Le et al. ................ 395/500.06 |
| 6,117,179 A | * 9/2000 | Tan et al. ...................... 703/14 |
| 6,175,946 B1 | * 1/2001 | Ly et al. .......................... 716/4 |
| 6,219,809 B1 | * 4/2001 | Noy ........................... 714/724 |
| 6,249,899 B1 | * 6/2001 | McBride et al. ............... 716/4 |
| 6,279,143 B1 | * 8/2001 | McBride et al. ............... 716/5 |
| 6,311,314 B1 | * 10/2001 | McBride ........................ 716/6 |

* cited by examiner

Primary Examiner—Vuthe Siek

(57) ABSTRACT

An Electrical Rules Check (ERC) methodology ensures the quality of an electrical circuit through the creation of up to four different data structures, corresponding to one or more nodes, one or more small nodes, one or more non-resistor elements, and one or more resistor elements of the circuit, that are used by an ERC program running on one or more processors. The creation of data structures for small nodes and resistor elements in which less information need be stored for use by the ERC program minimizes the amount of data storage that must be utilized.

62 Claims, 4 Drawing Sheets

FRAMEWORK FOR RULES CHECKING UTILIZING RESISTOR, NONRESISTOR, NODE AND SMALL NODE DATA STRUCTURES

FIELD OF THE INVENTION

This invention relates generally to rules checking, and more particularly to a methodology for reducing the computer storage required to perform an Electrical Rules Check (ERC) of a digital circuit design.

BACKGROUND OF THE INVENTION

An electrical circuit, such as a digital circuit design, may be thought of as having one or more elements and one or more nodes that serve as connection points to the elements. A node may serve as an interconnection point between two or more electrical elements. A node may additionally be considered a connection point that connects an element to something else; for instance, a node may serve as a connection point to an external environment in which the circuit is situated, such as an input or output point of the circuit. In light of these definitions of a node, it is possible to have a circuit design that has only one element and one node, two or more elements and one or more nodes, or one or more elements and two or more nodes, etc. In digital circuit design, nodes commonly connect electrical elements such as transistors and resistors. A netlist, or external representation of the circuit, simply specifies the physical interconnections or nodes between the electrical elements without providing information about various electrical parameters or measurements at those nodes. A netlist, then, is by itself insufficient to provide needed information about the nodes of an electrical circuit.

ERC software is often used to analyze electrical circuit design during design and implementation phases. It is critical to the successful implementation of an electrical circuit that certain information about elements and nodes be stored for use during ERC analysis of the circuit design. Each element in the circuit design requires storage that is used to record its connections to design nodes, generally referred to herein as element information. Similarly, each node requires storage that is used to record its timing characteristics and coupling information and interconnectivity information to other nodes and/or elements, generally referred to herein as node information. The amount of information that must be recorded for elements and nodes can vary greatly and is somewhat dependent upon the type of element or node in questions. Nodes that have connections to resistor elements, for example, have no timing or coupling information that is used in the Electrical Rule Checking of the circuit design; therefore the storage space allocated for timing and coupling information for a node having connections to resistor element is unused. Resistor elements have only two node connections while transistor elements have six, and perhaps more, node connections that must be stored.

In spite of the different amounts of information required for elements and nodes, however, the amount of computer storage space allocated for nodes and elements of a circuit design is typically consistent and thus impervious to variations in the amount of information that needs to be stored for various types of nodes and elements. Thus, a significant amount of the storage space allocated for node connection information of resistor elements is unused. This wasted computer storage can be especially significant for large, complex electrical designs such as Very Large Scale Integration (VLSI) integrated circuits (ICs). Suppose, for instance, that a design has 100,000 transistors and 1,000,000 resistors. Traditional space allocation makes no distinction between transistor elements and resistor elements and the amount of space allocated for each resistor and transistor will be the same. The storage space allocated for the million resistors will be largely wasted since the mount of information necessary to store for the resistors is much less than the amount of information necessary to store for transistors. The resistor storage space will thus be underutilized. There is therefore an unmet need in the art to reduce the size of computer storage that is required to perform an Electrical Rules Check (ERC) of a circuit design. Reducing the amount of storage would result in cost savings and increases in inefficiency of the ERC process.

SUMMARY OF THE INVENTION

It is therefore an object of the present invention to reduce the computer storage required to perform an Electrical Rules Check (ERC) of a digital circuit design.

Therefore, according to the present invention, a rules checking methodology analyzes an electrical circuit characterized as having one or more elements and one or more nodes, the "structures" of the circuit. Of particular interest to the methodology of the present invention is the creation of up to four different types of data structures specific to the type of element or node being analyzed. Thus, for each structure of the circuit, whether it be a node, a small node defined as being interconnected only to resistors, a non-resistor element, or a resistor element, a data structure representative of the structure is created. Creating the data structure includes creating a link of the data structure and filling one or more data fields with information specific to the structure; the information of the data fields is stored in a storage element, such as memory, and is used by one or more processors that run an ERC program which analyzes the electric circuit. The created data structure is placed in an appropriate linked list; a node data structure is placed in a node linked list, a small node data structure is placed in a small node linked list, a non-resistor element data structure is placed in a non-resistor element linked list, and a resistor element data structure is placed in a resistor element linked list.

The structures of the circuit are next analyzed by analyzing the data structures thus created and placed in appropriate linked lists by the one or more processors running the ERC program; the information stored in the data fields of the data structures are utilized by the program during the analysis. Analysis of the structures by the one or more processors may take place sequentially or in parallel. Prior to analysis, known topology types of the circuit may optionally be searched for and extracted. Following analysis, the information stored in the storage element about one or more data structures may be changed and the circuit re-analyzed in accordance with the changed information in order to enhance analysis of the circuit. The results of the analysis and/or the re-analysis of the circuit may be reported if desired. The methodology of the present invention may be implemented by a storage media containing the computer program for performing the ERC of the electrical circuit.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

Figure 1:
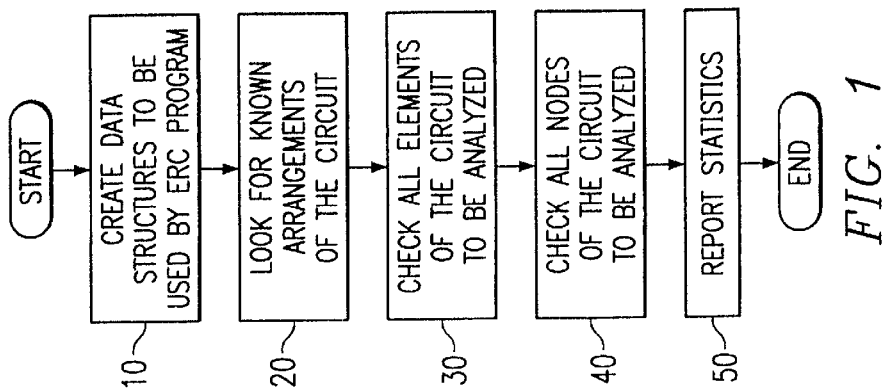
FIG. 1 illustrates a top level flow chart of rules checking code, according to the present invention.

An electrical circuit, such as a digital circuit design, may be analyzed by an Electrical Rules Check (ERC) methodology that is performed on the various elements and nodes that make up the circuit. Referring to FIG. 1, a top level flow chart of an ERC methodology, according to the present invention is shown. The first step of the methodology of the present invention, illustrated by Block 10, is to create the data structures of the nodes and elements of a circuit that will be utilized by the ERC program to analyze the circuit design. The next step of the ERC program is to search for known and expected arrangements of elements of the circuit at Block 20 by looking for and extracting known topology types of the circuit. For instance, in an electronic circuit certain pathsets between electronic elements of the circuit would be expected to be seen. If there are problems in the pathset, this would be indicative of problems in the netlist, or external representation, of the electronic circuit. The problems in the netlist could then be corrected. Known topology types of an electronic circuit could include, but are not limited to, static gate outputs, dynamic precharge nodes, dynamic gate inputs, block inputs, block outputs, and latches. As an option, information concerning the extraction of the topologies may be provided to the designer. Such information might contain a list of the assumptions used to find and extract the topologies. Further, the information might be a list of all of the topologies found and extracted. Based upon this information, the designer may make adjustments to the assumptions used to find and extract topologies or provide other hints to the rules checking software through an external information file.

It should be noted that an alternative to extracting topology types for the netlist of an electronic circuit is to blindly apply all the rules to each and every node and element of the electronic circuit, including all regular (non-small) nodes, small nodes, non-resistor elements, and resistor elements to be described herein. This approach, however, makes developing the limits of the checks, to be discussed in greater detail with respect to Blocks 30 and 40, very difficult because the limits have to be set so that they are applicable to all elements and nodes of the structure. For instance, the parameters of a dynamic gate can be quite different from those used to check a static gate. Yet another alternative to extracting topology types is to rely on the designer to assign all the attributes to each and every element and node of the structure. This provides the advantage that the designer is aware of every assumption of the rules checking. However, this approach requires quite a bit of time of the designer and the person who enters all these rules into the rules checking code and this process is prone to error.

Next, in Blocks 30 and 40, an analysis of the elements and nodes of the structure is performed. In Block 30, checks are performed on all elements of interest, such as non-resistor elements, of the structure in which all rules associated with a particular element are then applied to the element to determine if that element passes or fails certain criteria established for it. In Block 40, a check is performed on all the nodes of interest in the structure, such as regular, non-small nodes, which interconnect the elements of the structure being tested. It is noted that once the small node and resistor element data structures are created, as will be described, a check may not be performed on the small nodes and resistor element data structures of the circuit, but only on the regular nodes and non-resistive elements of the circuit. Finally, a report that illustrates the statistics compiled during the analysis of the structure elements and nodes is made available in Block 50. It is noted that in light of an ERC analysis of the circuit that certain information stored about the elements and nodes of the circuit could be changed, by changing data stored in data fields of the data structures representative of the circuit structures, and the ERC analysis performed again with the updated information. These steps of the methodology of the present invention will now be described in greater detail; of particular interest in the present invention is the creation of certain data structures in Block 10.

The present invention utilizes up to four different types of data structures to represent the various types of nodes and elements that make up a circuit design. In addition to the two standard data structures used to represent regular nodes and element of the design, referred to herein as regular nodes and non-resistor elements, the present invention utilizes a data structure representative of those nodes that have resistor connections, called a small node data structure, and a data structure representative of resistors, called a resistor element data structure. The four data structures will record only that information that will actually be used by the ERC program. The storage saved is the result of creating two new data structures specifically designed to represent resistors and nodes that have connections to resistors, respectively. The amount of information that must be stored for the small nodes is less than that which must be stored for regular nodes; this is because nodes that have connections to resistor elements may have no timing or coupling information that is used by the ERC program; there may not therefore need to be any storage allocated for this type of information for the small nodes. Likewise, the amount of information that must be stored for resistor elements is less than that which must be stored for regular elements; resistor elements have only two node connections that must be stored while transistor elements, for instance, may have six or more node connections that must be stored.

The present invention utilizes four linked lists to store data for nodes, non-resistor elements, small nodes, and resistors, respectively; this is different from the two linked lists that are used in traditional ERC programs to indiscriminately store all data associated with all nodes and all elements. Each item or entry in a linked list is a data structure having one or more data fields within which relevant information about the entry is stored. The node linked list, for instance, contains node data structures of the circuit design; each node data structure entry in the node linked list has one or more data fields into which relevant information about that particular node is stored in program memory of the ERC program. Relevant information appropriate to store in data fields of a node data structure includes: floating point values that describe rise and fall times, cross-capacitive coupling information, connection capacitance, inverted values, other nodes that are mutually exclusive to the particular node, type of node (clock, storage (such as a latch node), precharge, etc. that may be indicated by flag), node name, interconnectivity information, floating point values to describe a clock node, if applicable, and a pointer or link that points to the next data structure item in the node linked list; if the node data structure is the last entry in the node linked list, the link or pointer points to null or some value that indicates as much.

The small node linked list contains only those nodes that interconnect resistor elements of the design and, in contrast to the linked node list, each small node entry in the small node linked list requires fewer data fields to store relevant information and thus takes up less computer storage space as described above. Relevant information that may need to be stored in program memory for small nodes includes: interconnectivity to resistor elements, small node name, connection capacitance information, type of node (clock, storage, etc. that may be indicated by flag), and a pointer or link to the next data structure entry in the small node linked list; if the data structure is the last entry in the linked list, the link or pointer points to null or some value that indicates as much. It can be seen that much less information needs to be stored in the data fields associated with small node data structures that make up the small node linked list. In particular, tremendous storage savings may be realized by not having to store floating point information that describes rise and fall timing characteristics, cross-capacitive coupling, and the characteristics of a clock node. Floating point information about rise and fall times of a node, for instance, can take up 64 bits or more of storage space and not having to store that information means that much less storage space is required.

As with small nodes, the amount of information that must be stored for resistor elements is much less than that which must be stored for regular, non-resistor elements, such as transistors. A transistor is defined by three connections, one each for the gate, source, and drain of a MOSFET or one each for the base, collector, and emitter of a bipolar transistor, for instance. A resistor is defined by only two connections. In certain testing environments, it is desirable to test a circuit design not only for compliance with electrical rules but also for timing analysis. In such cases, the information about each element must be duplicated, yielding six, or perhaps more, connections for each transistor of the design that must be tracked by the testing environment. In the present invention, each element entry in the element linked list has relevant information stored in one or more data fields. The relevant information to be stored for non-resistor elements in the element linked list includes:

the element name, three (or six or perhaps more) connections, the type of transistor (P- or N-type), the width of the transistor, the length of the transistor, the direction of the signal (such as from source to drain, for instance), and the pointer to the next transistor element in the element linked list; transistor resistance is normally calculated as needed from the length and width of the transistor in questions. Far fewer information is stored for each data structure of the resistor linked list; relevant information for each resistor of the resistor linked list includes: two connections of the resistor, resistance value, and the pointer to the next resistor in the linked list.

The data fields, and thus storage space, associated with the small node linked list and the resistor element linked list is much smaller than that required for the node linked list and the non-resistor element linked list, respectively. In designs that have a great number of resistor elements, the amount of program storage space that is saved by storing only required information can be quite significant.

Figure 2:
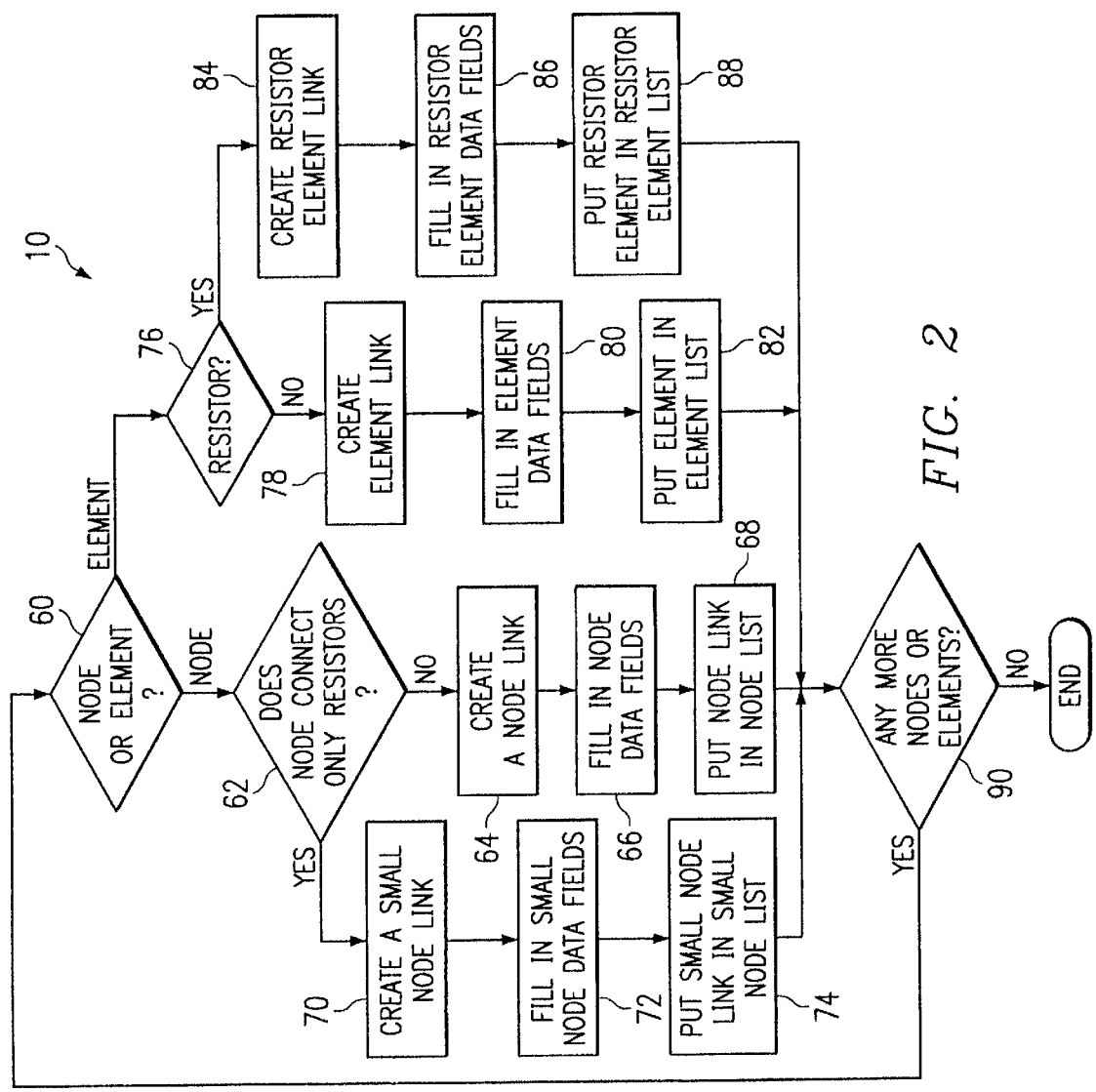
FIG. 2 illustrates a methodology for creating data structures and placing them in linked lists, according to the present invention.

Referring now to FIG. 2, the methodology of block 10 of FIG. 1 for creating the four types of data structures used in the present invention is illustrated. Circuit blocks 60 and 90 ensure that process 10 is performed for every node and element, including small nodes and resistor elements, contained in the electrical circuit being tested. At Decision Block 60, the inquiry is whether the structure of interest is a node or an element; as previously discussed a node is considered to link or interconnect two or more elements of the circuit. If the structure is a node, the inquiry at Decision Block 62 is whether the node interconnects only resistor elements. If it does not, then the node is just a regular node for which a node link is created at Block 64 for the node linked list into which the node will be placed. The data fields associated with the node data structure are filled at Block 66 with information relevant to the node and stored in computer storage. As previously described, relevant data field information of a regular node data structure may include information about the timing, cross-capacitive coupling, connection capacitance, inverted values, mutually exclusive nodes, node type, node name, interconnectivity, the clock mode, if any, and the link to the next item in the node linked list; if the regular node data structure is the last entry in the node linked list, the link or pointer points to null or some value that indicates as much.

The node link associated with the node is placed in the node linked list at Block 68. After Block 68, the inquiry at Decision Block 90 is whether there are any more nodes or elements of the circuit design for which data structures need to be created.

If the answer to the inquiry at Decision Block 62 was that the node being examined only interconnects resistor elements, and is thus a "small node," then a link for that node data structure is created at Block 70. At Block 72, the data fields for the small node data structure are filled with the relevant information. The amount of information to be stored in the data fields of a small node structure is much less than that stored for a regular node structure and can include information about interconnectivity to resistor elements, the name of the small node, connection capacitance information, the node type, and the link to the next entry in the small node linked list; if the small node data structure is the last entry in the small node linked list, the link or pointer points to null or some value that indicates as much. The small node link is placed in the small node linked list at Block 74. The flow continues to Decision Block 90 in order to determine whether there are any more nodes or elements of the circuit design for which data structures need to be created and placed in an appropriate linked list.

If the inquiry at Decision Block 60 revealed that the structure being considered is an element, such as a resistor or transistor, rather than a node, then the flow continues to Block 76. If the element is a resistor, as determined at Decision Block 76, then a link is created at Block 84 for the resistor data structure and the data fields associated with the resistor data structure are filled with relevant information at Block 86. Relevant information for a resistor element data structure includes the two connections of the resistor, its resistance value, and the pointer to the next resistor in the linked list. Next, the resistor element is placed in the resistor element linked list at Block 88.

If, on the other hand, the structure is determined to be a non-resistor element or a regular element, such as a transistor, than a link for that regular element is created at Block 78 and the data fields associated with the non-resistor element are filled at Block 80. Again, as discussed above, relevant information to be stored in the data fields of a non-resistor element data structure can include: the element name, three (or six or perhaps more) connections, the type of transistor, the width of the transistor, the length of the transistor, the direction of the signal, and the pointer to the next transistor element data structure in the element linked list. At Block 82, the element data structure is placed in the element linked list. The flow next continues to Decision Block 90 to ensure that data structures are created for every structure of the electrical circuit design being analyzed.

Figure 3:
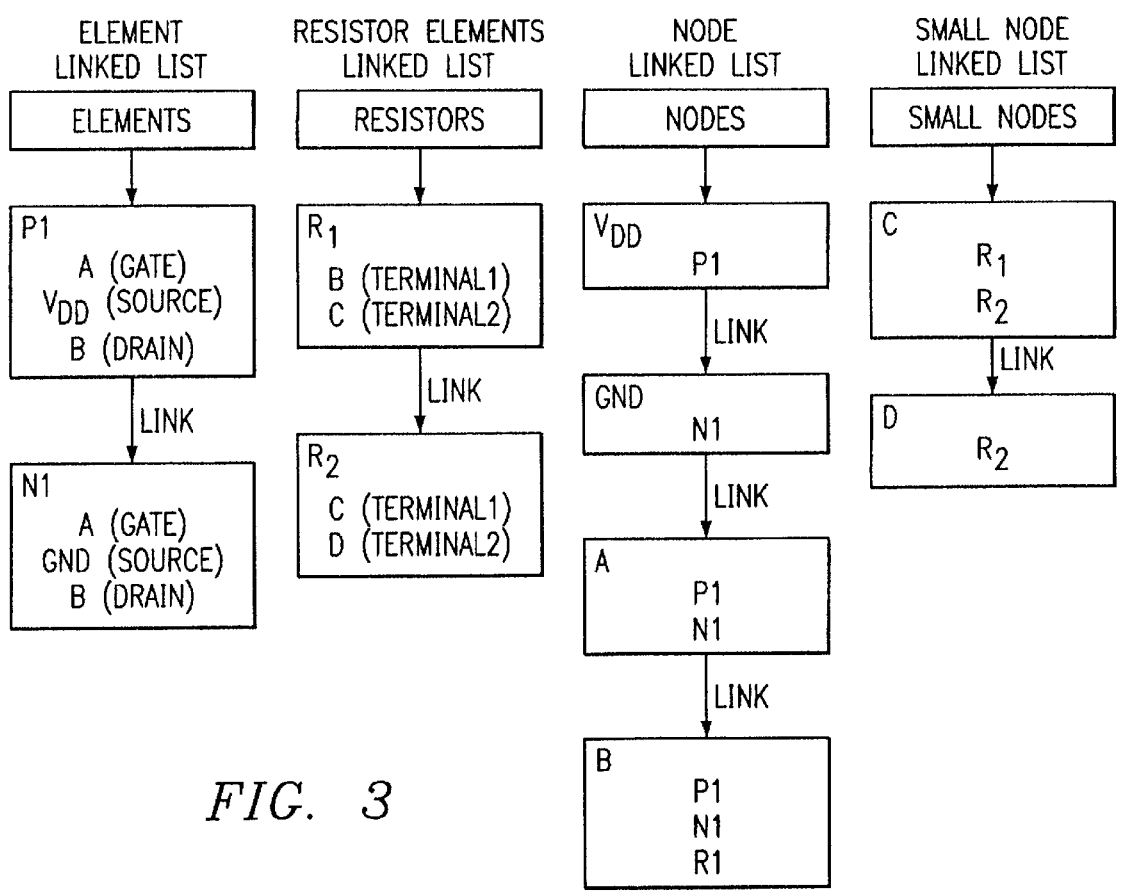
FIG. 3 is a schematic diagram of a representative electrical circuit of the type for which ERC may be performed, according to the present invention.

An example of an electrical circuit to be subjected to ERC is illustrated in FIG. 3. It can be seen that the simple circuit of FIG. 3 contains four elements: p-channel transistor P1, n-channel transistor N1, resistor R1, and resistor R2. There are six nodes of the circuit: the Vdd node formed at the source of transistor P1, the ground node formed at the source of transistor T1, node A at the input of the circuit that is formed by the connection of the gates of transistors P1 and N1, node B formed by the connection of the drains of transistors P1 and N1 and the first terminal of resistor R1, node C formed by the connection of the second terminal of resistor R1 to the first terminal of resistor R2, and node D at the output of the circuit that is connected to the second terminal of resistor R2. Between the six nodes of the circuit and the four elements of the circuit there are a total of 10 structures for which the methodology 10 of FIG. 2 must be applied.

The appropriate data structures are created for each of the ten structures of the circuit of FIG. 3 and placed into the appropriate linked lists as shown. P-channel transistor P1 is determined to be a non-resistor element at Block 76 and the functionality of Blocks 78–82 are performed to place a non-resistor element data structure representative of non-resistor element P1 into the element linked list with a created link pointing to the next entry in the element linked list, N1, and with three data fields containing the interconnectivity information about each of the three connections of P1. N-channel transistor N1 is determined to also be a non-resistor element at Block 76 and so Blocks 78–82 are performed to place a non-resistor element data structure representative of transistor NI as the second entry into the element linked list after transistor P1. The data fields associated with the N1 element data structure contain interconnectivity information about the three connections, or terminals, of the element: the gate terminal is connected to Node A, the source terminal is connected to the ground node, and the drain terminal of N1 is connected to node B.

Elements R1 and R2 are determined to be resistor elements at Decision Blocks 60 and 76 and so are placed in the resistor element linked list in accordance with Blocks 84–88 of FIG. 2. The resistor element data structure representative of resistor element R1 has a link that points to the next entry in the resistor element linked list, R2. The three data fields of the R1 resistor element data structure contain connectivity information about the two terminals of R1: terminal 1 is connected to node B and terminal 2 is connected to node C. Similarly, the three data fields of R2 resistor element data structure provide information that terminal 1 of R2 is connected to node C while terminal 2 of R2 is connected to node D.

The third linked list is the node linked list into which data structure representative of nodes A, B, the Vdd node formed at the source of transistor P1, and the ground node formed connected to the source of transistor NI are placed. This third linked list is formed by Blocks 60–68 of FIG. 2. The data fields entries of the node data structure representative of the node formed by Vdd and P1 include interconnectivity information about the source of P1 and a link that points to the next node data structure in the linked list. The second entry in the node linked list is the node data structure representative of the node formed by the source of transistor N1 connected to ground; data entries for this node include interconnectivity information about the source of transistor N1 and the link that points to node A data structure, the next data structure entry in the linked list. Node 1 data structure has two data fields that contain interconnectivity information about transistors P1 and N1 and a third data field that contains the link to node B, the fourth and last entry in the node linked list. Three data fields of node B data structure contain interconnectivity information about transistors P1, N1, and R1.

The last linked list is the small node linked list that is formed by Blocks 60, 62, and 70–74 of the methodology of FIG. 2. Nodes C and D are categorized as small nodes because, at Decision Block 62, they were determined to interconnect only resistors; it can be seen that node C provides interconnection for only resistors R1 and R2 while output node D is connected only to resistor R2. There are three data fields for the node data structure representative of node C, the first entry in the small node linked list. The first two data fields contain connectivity information about resistors R1 and R2 while the third data field contains the link that points to the node data structure representative of node D, the second data structure entry in the linked list. Node D data structure has only a single data field that contains interconnectivity information about resistor R2, as shown.

It can be seen that the data field entries for each of the data structures representative of the elements and nodes of the circuit of FIG. 3 contain only interconnectivity and linkage information. This is for simplicity of explanation only. The present invention is generally applicable to very complex integrated circuit design, such as that embodied in very large scale integration (VLSI) chips, in which the data fields of elements and nodes of the circuit can most assuredly be expected to contain much more information than the data fields associated with small nodes and resistor elements.

The remaining steps 30–50 of FIG. 1 for performing an ERC of a circuit design will now be described in more detail. It is important to note that not all nodes and elements of the entire electrical circuit or structure need be checked. In fact, once the node, small node, resistor element, and non-resistor element data structures are created in Block 10 of FIG. 1, it is not necessary to performance analysis checks on small nodes and resistor elements of the circuit. This has the advantage of improving run time since only the regular nodes in the node linked list and the regular, non-resistor elements in the non-resistor linked list are checked in Blocks 30 and 40

Figure 4:
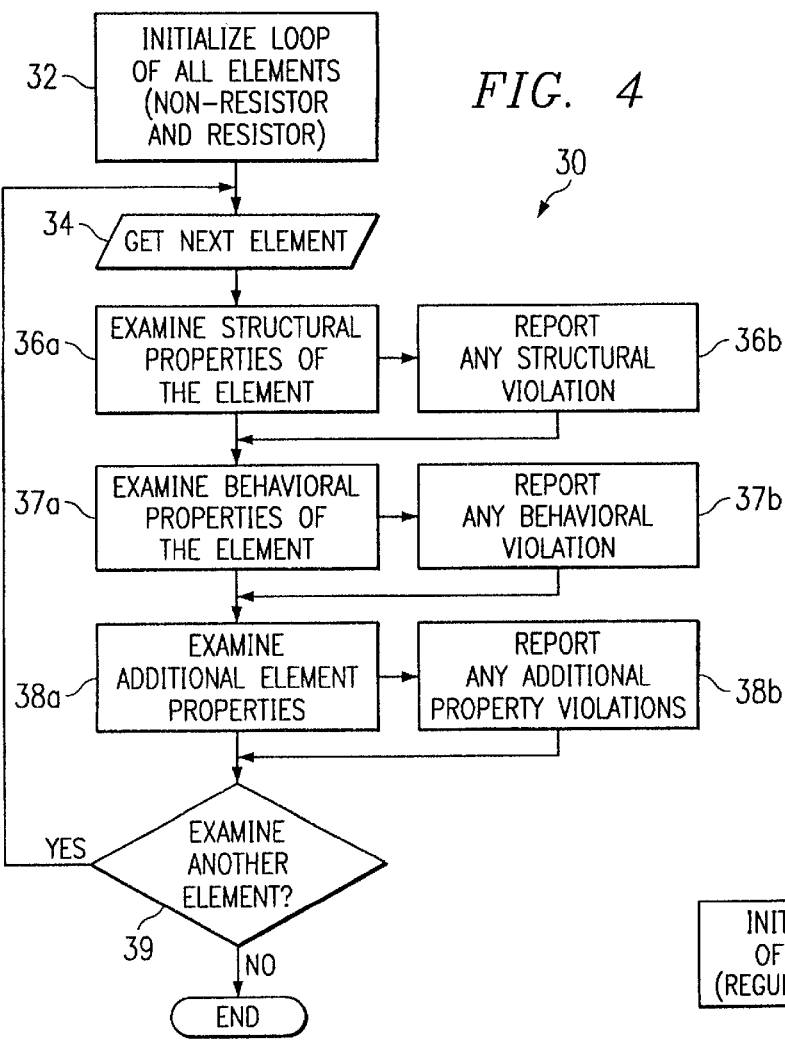
FIG. 4 illustrates the steps taken in Block 30 of FIG. 1 to perform a check on the structures of the circuit to be analyzed, according to the present invention.

Referring now to the flowchart 30 of FIG. 4, the steps taken in Block 30 of FIG. 1 to perform a check on the elements of the structure to be analyzed are illustrated. In Block 32, the loop of the elements of the structure, both non-resistor (regular) elements and resistive elements, are initialized. Next, in Block 34, an element to be analyzed is chosen. One or more properties of the element are then examined at Blocks 36–38. The properties to be examined may be structural properties, as in Block 36a, or behavioral properties, as in Block 37a. Examination of multiple properties of an element could be performed simultaneously, in parallel, if so desired to reduce the time associated with the examination of an element. It is herein noted that the properties of the element to be examined are stored in one or more data fields of the element data structure.

Structural properties have to do with how elements and nodes interact with respect to one another. The structure of an element or node, or a group of elements and nodes, can affect the behavior of other elements or nodes or groups of elements and nodes. A dimension of an element is an example of a structural property and may be any relevant characteristic of the element that is of particular concern. For instance, if the element is a transistor, such as a field effect transistor (FET), the dimension could be the gate width of the transistor. Behavioral properties have to do with how elements and nodes, or groups of elements and nodes, react to stimuli to which they are subjected. The stimuli may be long term stimuli, as in the case of hot electrons in an electrical structure, or short term stimuli, such as changes in voltage, temperature, or load conditions.

If the structural property being examined at Block 36a is not within acceptable limits, then the violation is reported at Block 36b. Similarly, if the behavioral property being examined at Block 37a is not within acceptable limits, then the violation is reported at Block 37b. Limits may be expressed in various forms well known in the art. Linear limits may be expressed as a lower limit, an upper limit, or within ± a limit. For non-linear measurements, the use of polynomial coefficients and look-up tables may be used. Moreover, acceptable limits of a dimension may be set by the user of the invention to any desirable value. Additional structural or behavioral properties of an element are examined at Block 38a and any additional property violations are reported at Block 38b as shown. Finally, at Decision Block 39 the process is directed back to Block 34 if more elements are to be examined or directed back to Block 40 of the overall flow of FIG. 1 if all elements to be analyzed, including non-resistor elements and resistor elements have been examined.

Figure 5:
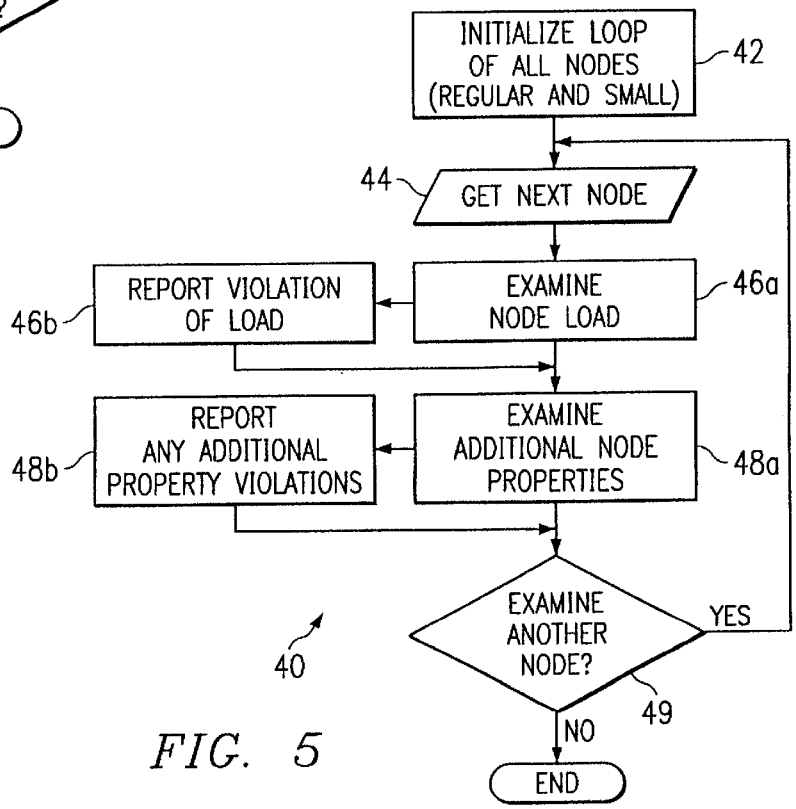
FIG. 5 illustrates the steps taken in Block 40 of FIG. 1 to perform a check on the structures of the circuit to be analyzed, according to the present invention.

Similar in flow to FIG. 4, in FIG. 5 the steps taken in Block 40 of FIG. 1 to perform a check on the nodes of the structure to be analyzed are illustrated. In Block 42, the loop of the nodes of the structure, both regular nodes and small nodes, are initialized. Next, in Block 44, a node to be analyzed is chosen; the node may be either a regular node or a small node. The load or other property of the selected node is examined at Block 46a. If the load is not within acceptable limits, the violation is reported at Block 46b. Acceptable limits of a load may be set by the user of the invention to be any appropriate value. Consider, for instance, an electronic circuit example in which the voltage at a node is being measured. The acceptable value of voltage may be 5±0.5 volts. If the voltage at the node being tested in less than 4.5 volts or greater than 5.5 volts, then the violation would be reported at Block 46b. At Block 48a additional node properties are examined for a particular node and any additional property violations that may exist are reported at Block 48b. Finally, at Decision Block 49 the process is directed back to Block 44 if more nodes (regular and/or small) are to be examined or returned to Block 50 of the overall flow of FIG. 1 if all nodes to be analyzed have been examined. It is noted here that the load or other property of a node that is examined is information that is stored within one or more data fields of the particular node data structure as described above. After an ERC of the circuit is complete, the information stored in data fields of various data structures that are representative of node and/or element structures of the circuit may be changed and the ERC analysis of the circuit performed again in accordance with the changed circuit information.

A word concerning node loads is appropriate here. A node load may be thought of as any measurable characteristic of concern at the node. For instance, in an electrical circuit the capacitance or voltage present at a particular node that interconnects electrical elements may be important to know. Similarly, the amplitude or frequency of a signal at the node in such a circuit may be critical. Moreover, there are different types of nodes that may be examined. Consider a storage node. In an electric circuit, a storage node, such as a latch node, may store capacitance or voltage. Storage nodes and precharge nodes are commonly found in electrical circuits.

The examination of multiple properties or loads of a node could be performed simultaneously, in parallel, if so desired to reduce the time associated with the examination of a node. Additionally, examination of properties of one or more elements as shown in FIG. 4 could be performed simultaneously to the examination of properties of one or more nodes of FIG. 5.

It is important to note that once analysis of an element (non-resistor or resistor) or node (regular or small) has commenced, the analysis of that element or node preferably continues until it is complete as indicated in FIGS. 4 and 5. For instance, if the program employs a single processing unit, then analysis of the element or node occurs in a sequential fashion such that once analysis of a particular element or node commences, the analysis continues until it is complete for that element or node. Analysis of the rules and properties of another element or node does not commence until the analysis for the previous element or node is complete. If, on the other hand, the program employs two or more processors operating in a parallel fashion, then each processor may operate at the same time as any processor, but analysis of a particular element or node by a particular processor is preferably completed before analysis of another element or node by the same processor may commence. The processor could be, but is not limited to, any electrical, mechanical or biological data processing unit such as a microprocessor, an electromechanical device, or a person. An important advantage of this approach to analysis ordering to examine all the rules or properties of a particular element or node at one time is that the locality of the structure data for the elements and nodes is maintained for the analysis, thereby speeding up the analysis and making it more efficient.

Figure 6:
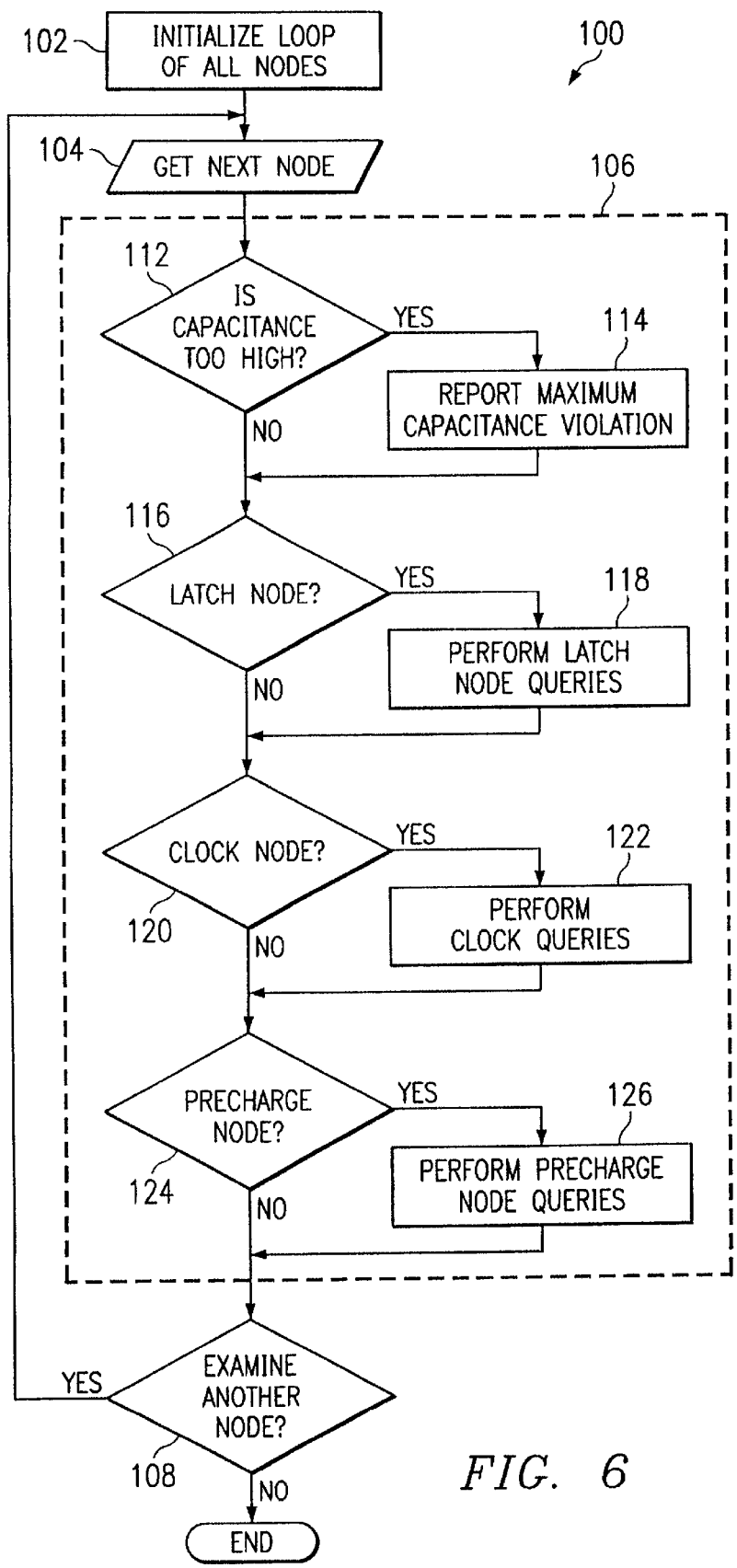
FIG. 6 illustrates a more detailed example of the flow chart of FIG. 5 for an electronic circuit, according to the present invention.

Reference to FIG. 6 provides a more detailed example of the flow of FIG. 5 for an electronic circuit. Particular emphasis is placed on possibilities for Block 106, which encompasses various types of node analysis. Decision Block 112 inquires about whether capacitance at the node being examined is within capacitance limits; information about the capacitance of the node is stored in one or more data fields of the appropriate node data structure associated with the node being examined. If it is not, then violation of the acceptable capacitance for that particular node is reported at Block 114. Next, Decision Blocks 116, 120, and 124 inquire about the type of node and then perform appropriate testing; information about the node type is contained in one or more data fields of the node data structure. Decision Block 116 inquires as to whether the node is a latch node. If the node being examined is a latch node, then latch node inquiries are performed at Block 118. At Block 120, the question is whether the node is characterized as being a clock signal. If so, then inquiries about the clock signal are performed at Block 122. Finally, at Decision Block 124 the flow is directed to Block 126 for precharge node testing if the node is a precharge node.

While the examination of node loads is performed in a chronological, serial fashion at Block 106, one skilled in the art will recognize that the queries of Blocks 112 to 126 could be performed in parallel to reduce the run time required to complete node testing. For instance, the capacitance testing of Blocks 112 and 114 could be performed simultaneously with the latch node testing of Blocks 116 and 118 and the clock signal testing of Blocks 120 and 122. As an example, such parallel testing could be employed in a system having, for instance, 10 microprocessor units, in order to test a structure having 1,000 or more nodes, with each processing unit simultaneously testing 100 different nodes of the structure in order to decrease processing time.

While the invention has been particularly shown and described with reference to a preferred embodiment, it will be understood by those skilled in the art that various changes in form and detail may be made therein without departing from the spirit and scope of the invention.

What is claimed is:

1. A method of using one or more processors to perform an Electrical Rule Check (ERC) of a circuit, comprising:
    for each structure of a plurality of structures of the circuit, said circuit having two or more types of structure, comprising the following to create a plurality of data structures:
        creating a data structure, comprising:
            creating a link of the data structure that points to a subsequent data structure; and
            filling one or more data fields of the data structure with information corresponding to the structure that is used by the one or more processors to perform the ERC of the circuit, wherein the data structure created for each structure and the information filling the one or more data fields of the data structure is determined by a type of each structure;
        storing the information in the one or more data fields in a storage element;
        placing the data structure in a linked list of a plurality of linked lists; and
    analyzing one or more structures of the plurality of structures of the circuit by using the one or more processors to analyze one or more data structures of the plurality of data structures in accordance with the information stored in the storage element.

2. The method of claim 1, wherein placing the data structure in the linked list is accomplished by placing the link of the data structure in the linked list.

3. The method of claim 1, wherein each structure of the plurality of structures of the circuit is either a node, a small node, a non-resistor element, or a resistor element.

4. The method of claim 3, wherein a structure of the plurality of structures is a node and the data structure of the node is a node data structure that is placed in a node linked list and the information stored in the one or more data fields of the node data structure is node information.

5. The method of claim 4, wherein the node information comprises one or more of the following: rise and fall time information, cross-capacitive coupling information, connection capacitance information, mutually exclusive node information, node type, node name, interconnectivity information, clock node information, the link of the node data structure.

6. The method of claim 3, wherein a structure of the plurality of structures is a small node and the data structure of the small node is a small node data structure that is placed in a small node linked list and the information stored in the one or more data fields of the small node data structure is small node information.

7. The method of claim 6, wherein the small node information comprises one or more of the following: connection capacitance information, node type, node name, interconnectivity information, the link of the small node data structure.

8. The method of claim 3, wherein a structure of the plurality of structures is a non-resistor element and the data structure of the non-resistor element is a non-resistor element data structure that is placed in a non-resistor linked list and the information stored in the one or more data fields of the non-resistor element data structure is non-resistor information.

9. The method of claim 8, wherein the non-resistor information comprises one or more of the following: non-resistor element name, connection information, non-resistor element type, sizing information, signal direction information, the link of the non-resistor element data structure.

10. The method of claim 3, wherein a structure of the plurality of structures is a resistor element and the data structure of the resistor element is a resistor element data structure that is placed in a resistor linked list and the information stored in the one or more data fields of the resistor element data structure is resistor information.

11. The method of claim 10, wherein the resistor information comprises one or more of the following: resistor element name, connection information, the link of the resistor element data structure.

12. The method of claim 1, wherein analyzing the plurality of structures occurs sequentially.

13. The method of claim 12, wherein once analysis of a first structure of the plurality of structures by a processor of the one or more processors commences, analysis of a second structure of the plurality of structures by the processor does not commence until the analysis of the first structure is complete.

14. The method of claim 1, wherein analyzing the plurality of structures occurs in parallel by two or more processors of the one or more processors.

15. The method of claim 1, further comprising:
    as a result of the analysis of the plurality of structures of the circuit, changing the information stored in the storage element in order to enhance analysis of the circuit; and
    using the one or more processors to reanalyze the plurality of structures of the circuit in accordance with the changed information stored in the storage element.

16. The method of claim 1, prior to analyzing the plurality of structures further comprising:
    searching for and extracting each known topology of one or more known topologies of the circuit.

17. The method of claim 1, further comprising:
    reporting whether each structure of the circuit meets established criteria.

18. The method of claim 1, analyzing the plurality of structures of the circuit comprises:
    examining at least one property of each structure of the plurality of structures to determine whether the at least one property is within an acceptable limit.

19. A storage medium containing a computer program that uses one or more processors to perform an Electrical Rule Check (ERC) of a circuit, comprising:
    for each structure of a plurality of structures of the circuit, said circuit having two or more types of structure, comprising the following to create a plurality of data structures:

instructions for creating a data structure, comprising:
    instructions for creating a link of the data structure that points to a subsequent data structure; and
    instructions for filling one or more data fields of the data structure with information corresponding to the structure that is used by the one or more processors to perform the ERC of the circuit, wherein the data structure created for each structure and the information filling the one or more data fields of the data structure is determined by a type of each structure;
instructions for storing the information in the one or more data fields in a storage medium;
instructions for placing the data structure in a linked list of a plurality of linked lists; and
instructions for analyzing one or more structures of the plurality of structures of the circuit by using the one or more processors to analyze one or more data structures of the plurality of data structures in accordance with the information stored in the storage medium.

20. The media of claim 19, wherein placing the data structure in the linked list is accomplished by instructions for placing the link of the data structure in the linked list.

21. The media of claim 19, wherein each structure of the plurality of structures of the circuit is either a node, a small node, a non-resistor element, or a resistor element.

22. The media of claim 21, wherein a structure of the plurality of structures is a node and the data structure of the node is a node data structure that is placed in a node linked list and the information stored in the one or more data fields of the node data structure is node information.

23. The media of claim 22, wherein the node information comprises one or more of the following: rise and fall time information, cross-capacitive coupling information, connection capacitance information, mutually exclusive node information, node type, node name, interconnectivity information, clock node information, the link of the node data structure.

24. The media of claim 21, wherein a structure of the plurality of structures is a small node and the data structure of the small node is a small node data structure that is placed in a small node linked list and the information stored in the one or more data fields of the small node data structure is small node information.

25. The media of claim 24, wherein the small node information comprises one or more of the following: connection capacitance information, node type, node name, interconnectivity information, the link of the small node data structure.

26. The media of claim 21, wherein a structure of the plurality of structures is a non-resistor element and the data structure of the non-resistor element is a non-resistor element data structure that is placed in a non-resistor linked list and the information stored in the one or more data fields of the non-resistor element data structure is non-resistor information.

27. The media of claim 26, wherein the non-resistor information comprises one or more of the following: non-resistor element name, connection information, non-resistor element type, sizing information, signal direction information, the link of the non-resistor element data structure.

28. The media of claim 21, wherein a structure of the plurality of structures is a resistor element and the data structure of the resistor element is a resistor element data structure that is placed in a resistor linked list and the information stored in the one or more data fields of the resistor element data structure is resistor information.

29. The media of claim 28, wherein the resistor information comprises one or more of the following: resistor element name, connection information, the link of the resistor element data structure.

30. The media of claim 19, wherein instructions for analyzing the plurality of structures occur sequentially.

31. The media of claim 30, wherein once instructions for analysis of a first structure of the plurality of structures by a processor of the one or more processors commence, instructions for analysis of a second structure of the plurality of structures by the processor do not commence until the analysis of the first structure is complete.

32. The media of claim 19, wherein instructions for analyzing the plurality of structures occur in parallel by two or more processors of the one or more processors.

33. The media of claim 19, further comprising:
    as a result of the analysis of the plurality of structures of the circuit, changing the information stored in the storage medium in order to enhance analysis of the circuit; and
    instructions for using the one or more processors to reanalyze the plurality of structures of the circuit in accordance with the changed information stored in the storage medium.

34. The media of claim 19, prior to analyzing the plurality of structures further comprising:
    instructions for searching for and extracting each known topology of one or more known topologies of the circuit.

35. The media of claim 19, further comprising:
    instructions for reporting whether each structure of the circuit meets established criteria.

36. The media of claim 19, analyzing the plurality of structures of the circuit comprises:
    instructions for examining at least one property of each structure of the plurality of structures to determine whether the at least one property is within an acceptable limit.

37. A method of using one or more processors to perform an Electrical Rule Check (ERC) of a circuit, comprising:
    a) determining whether a structure of a plurality of structures of the circuit is a node, a small node, a non-resistor element, or a resistor element;
    b) when the structure is a node, further comprising:
        creating a node data structure representative of the node, comprising:
            creating a link of the node data structure that points to a subsequent node data structure; and
            filling one or more data fields of the node data structure with node information corresponding to the node that is used by the one or more processors to perform the ERC of the circuit;
        storing the node information in the one or more data fields in a storage medium; and
        placing the node data structure in a node linked list of a plurality of linked lists;
    c) when the structure is a small node, further comprising:
        creating a small node data structure representative of the small node, comprising:
            creating a link of the small node data structure that points to a subsequent small node data structure; and
            filling one or more data fields of the small node data structure with small node information corresponding to the small node that is used by the one or more processors to perform the ERC of the circuit;

storing the small node information in the one or more data fields in the storage medium; and placing the small node data structure in a small node linked list of the plurality of linked lists;

d) when the structure is a non-resistor element, further comprising:

creating a non-resistor element data structure representative of the non-resistor element, comprising:

creating a link of the non-resistor element data structure that points to a subsequent non-resistor element data structure; and filling one or more data fields of the non-resistor element data structure with non-resistor element information corresponding to the non-resistor element that is used by the one or more processors to perform the ERC of the circuit;

storing the non-resistor element information in the one or more data fields in the storage medium; and placing the non-resistor element data structure in a non-resistor element linked list of the plurality of linked lists;

e) when the structure is a resistor element, further comprising:

creating a resistor element data structure representative of the resistor element, comprising:

creating a link of the resistor element data structure that points to a subsequent resistor element data structure; and filling one or more data fields of the resistor element data structure with resistor element information corresponding to the resistor element that is used by the one or more processors to perform the ERC of the circuit;

storing the resistor element information in the one or more data fields in the storage medium; and placing the resistor element data structure in a resistor element linked list of the plurality of linked lists;

f) repeating a)-e) for each structure of the plurality of structures of the circuit to generate a plurality of data structures placed into the plurality of linked lists; and g) analyzing one or more structures of the plurality of structures of the circuit by using the one or more processors to analyze the one or more data structures of the plurality of data structures in accordance with the information stored in the storage medium.

38. The method of claim 37, wherein placing the node data structure in the node linked list is accomplished by placing the link of the node data structure in the node linked list; wherein placing the small node data structure in the small node linked list is accomplished by placing the link of the small node data structure in the small node linked list; placing the non-resistor element data structure in the non-resistor element linked list is accomplished by placing the link of the non-resistor element data structure in the non-resistor element linked list; and wherein placing the resistor element data structure in the resistor element linked list is accomplished by placing the link of the resistor element data structure in the resistor element linked list.

39. The method of claim 37, wherein the node information comprises one or more of the following: rise and fall time information, cross-capacitive coupling information, connection capacitance information, mutually exclusive node information, node type, node name, interconnectivity information, clock node information, the link of the node data structure.

40. The method of claim 37, wherein the small node information comprises one or more of the following: connection capacitance information, node type, node name, interconnectivity information, the link of the small node data structure.

41. The method of claim 37, wherein the non-resistor information comprises one or more of the following: non-resistor element name, connection information, non-resistor element type, sizing information, signal direction information, the link of the non-resistor element data structure.

42. The method of claim 37, wherein the resistor information comprises one or more of the following: resistor element name, connection information, the link of the resistor element data structure.

43. The method of claim 37, wherein analyzing the plurality of structures occurs sequentially.

44. The method of claim 43, wherein once analysis of a first structure of the plurality of structures by a processor of the one or more processors commences, analysis of a second structure of the plurality of structures by the processor does not commence until the analysis of the first structure is complete.

45. The method of claim 37, wherein analyzing the plurality of structures occurs in parallel by two or more processors of the one or more processors.

46. The method of claim 37, further comprising:

as a result of the analysis of the plurality of structures of the circuit, changing the information stored in the storage medium in order to enhance analysis of the circuit; and using the one or more processors to reanalyze the plurality of structures of the circuit in accordance with the changed information stored in the storage medium.

47. The method of claim 37, prior to analyzing the plurality of structures further comprising:

searching for and extracting each known topology of one or more known topologies of the circuit.

48. The method of claim 37, further comprising:

reporting whether each structure of the circuit meets established criteria.

49. The method of claim 37, analyzing the plurality of structures of the circuit comprises:

examining at least one property of each structure of the plurality of structures to determine whether the at least one property is within an acceptable limit.

50. A storage medium containing a computer program that uses one or more processors to perform an Electrical Rule Check (ERC) of a circuit, comprising:

a) instructions for determining whether a structure of a plurality of structures of the circuit is a node, a small node, a non-resistor element, or a resistor element;

b) when the structure is a node, further comprising:

instructions for creating a node data structure representative of the node, comprising:

instructions for creating a link of the node data structure that points to a subsequent node data structure; and instructions for filling one or more data fields of the node data structure with node information corresponding to the node that is used by the one or more processors to perform the ERC of the circuit;

instructions for storing the node information in the one or more data fields in a storage medium; and instructions for placing the node data structure in a node linked list of a plurality of linked lists;

c) when the structure is a small node, further comprising:

instructions for creating a small node data structure representative of the small node, comprising:

instructions for creating a link of the small node data structure that points to a subsequent small node data structure; and instructions for filling one or more data fields of the small node data structure with small node information corresponding to the small node that is used by the one or more processors to perform the ERC of the circuit;

instructions for storing the small node information in the one or more data fields in the storage medium; and instructions for placing the small node data structure in a small node linked list of the plurality of linked lists;

d) when the structure is a non-resistor element, further comprising:

instructions for creating a non-resistor element data structure representative of the non-resistor element, comprising:

instructions for creating a link of the non-resistor element data structure that points to a subsequent non-resistor element data structure; and instructions for filling one or more data fields of the non-resistor element data structure with non-resistor element information corresponding to the non-resistor element that is used by the one or more processors to perform the ERC of the circuit;

instructions for storing the non-resistor element information in the one or more data fields in the storage medium; and instructions for placing the non-resistor element data structure in a non-resistor element linked list of the plurality of linked lists;

e) when the structure is a resistor element, further comprising:

instructions for creating a resistor element data structure representative of the resistor element, comprising:

instructions for creating a link of the resistor element data structure that points to a subsequent resistor element data structure; and instructions for filling one or more data fields of the resistor element data structure with resistor element information corresponding to the resistor element that is used by the one or more processors to perform the ERC of the circuit;

instructions for storing the resistor element information in the one or more data fields in the storage medium; and instructions for placing the resistor element data structure in a resistor element linked list of the plurality of linked lists;

f) repeating a)-e) for each structure of the plurality of structures of the circuit to generate a plurality of data structures placed into the plurality of linked lists; and g) instructions for analyzing one or more structures of the plurality of structures of the circuit by using the one or more processors to analyze one or more data structures of the plurality of data structures in accordance with the information stored in the storage medium.

51. The media of claim 50, wherein placing the node data structure in the node linked list is accomplished by instructions for placing the link of the node data structure in the node linked list; wherein placing the small node data structure in the small node linked list is accomplished by instructions for placing the link of the small node data structure in the small node linked list; placing the non-resistor element data structure in the non-resistor element linked list is accomplished by instructions for placing the link of the non-resistor element data structure in the non-resistor element linked list; and wherein placing the resistor element data structure in the resistor element linked list is accomplished by instructions for placing the link of the resistor element data structure in the resistor element linked list.

52. The media of claim 50, wherein the node information comprises one or more of the following: rise and fall time information, cross-capacitive coupling information, connection capacitance information, mutually exclusive node information, node type, node name, interconnectivity information, clock node information, the link of the node data structure.

53. The media of claim 50, wherein the small node information comprises one or more of the following: connection capacitance information, node type, node name, interconnectivity information, the link of the small node data structure.

54. The media of claim 50, wherein the non-resistor information comprises one or more of the following: non-resistor element name, connection information, non-resistor element type, sizing information, signal direction information, the link of the non-resistor element data structure.

55. The media of claim 50, wherein the resistor information comprises one or more of the following: resistor element name, connection information, the link of the resistor element data structure.

56. The media of claim 50, wherein instructions for analyzing the plurality of structures occur sequentially.

57. The media of claim 56, wherein once analysis of a first structure of the plurality of structures by a processor of the one or more processors commences, instructions for analysis of a second structure of the plurality of structures by the processor do not commence until the analysis of the first structure is complete.

58. The media of claim 50, wherein instructions for analyzing the plurality of structures occur in parallel by two or more processors of the one or more processors.

59. The media of claim 50, further comprising:

as a result of the analysis of the plurality of structures of the circuit, instructions for changing the information stored in the storage medium in order to enhance analysis of the circuit; and instructions for using the one or more processors to reanalyze the plurality of structures of the circuit in accordance with the changed information stored in the storage medium.

60. The media of claim 50, prior to analyzing the plurality of structures further comprising:

instructions for searching for and extracting each known topology of one or more known topologies of the circuit.

61. The media of claim 50, further comprising:

instructions for reporting whether each structure of the circuit meets established criteria.

62. The media of claim 50, analyzing the plurality of structures of the circuit comprises:

instructions for examining at least one property of each structure of the plurality of structures to determine whether the at least one property is within an acceptable limit.

* * * * *